United States Patent [19]

Rissotti et al.

[11] Patent Number: 4,718,549
[45] Date of Patent: Jan. 12, 1988

[54] CONTAINER FOR THE STORAGE AND SHIPMENT OF SILICON DISKS OR WAFERS

[75] Inventors: Luigi Rissotti, Vercelli; Moreno Morici, Cameri; Fabrizio Leoni, S-Trecate; Adriano Girardi, Bellinzago, all of Italy

[73] Assignee: Dynamit Nobel Silicon S.p.A., Novara, Italy

[21] Appl. No.: 837,758

[22] Filed: Mar. 10, 1986

[30] Foreign Application Priority Data

Mar. 8, 1985 [IT] Italy .................. 47788 A/85

[51] Int. Cl.⁴ ................ B65D 85/30; B65D 57/00
[52] U.S. Cl. ..................... 206/334; 206/328; 206/454; 118/500
[58] Field of Search ............... 206/454–456, 206/555, 328, 334, 332, 45.19, 444; 118/500, 728, 729; 220/4 B, 4 E, 410

[56] References Cited

U.S. PATENT DOCUMENTS

| | | | |
|---|---|---|---|
| 2,999,611 | 9/1961 | Paulson | 220/306 |
| 4,043,451 | 8/1977 | Johnson | 206/454 |
| 4,061,228 | 12/1977 | Johnson | 206/454 |
| 4,129,211 | 12/1978 | Clement et al. | 206/561 |
| 4,171,740 | 10/1979 | Clement et al. | 206/454 |
| 4,248,346 | 2/1981 | Johnson | 206/334 |
| 4,450,960 | 5/1984 | Johnson | 206/586 |
| 4,471,716 | 9/1984 | Milliren | 211/41 |
| 4,520,925 | 6/1985 | Johnson | 206/334 |
| 4,555,024 | 11/1985 | Voss et al. | 206/454 |
| 4,557,382 | 12/1985 | Johnson | 206/454 |

Primary Examiner—George E. Lowrance
Assistant Examiner—Brenda J. Ehrhardt
Attorney, Agent, or Firm—Antonelli, Terry & Wands

[57] ABSTRACT

A container for the storage and shipment of silicon wafers has three parts; namely:

(1) a lower box half,
(2) an upper box half or a lid which, when joined together, forms an external protective box-like receptacle of the container, and
(3) a cassette having ribs defining seats for accommodating the silicon wafers arranged in the interior of the box-like receptacle. The two box halves are closed in a shape-mating, releasable fashion and can be fixedly clamped together with the cassette by restraining action of a lock arrangement. Additional auxiliary ribs are provided at the upper box half to effect a fixed clamping of the cassette and to retain the silicon wafers in the grooves or seats of the cassette. Guide rails are arranged in the box halves to engage the cassette and prevent movement within the box-like receptacle.

21 Claims, 10 Drawing Figures

CONTAINER FOR THE STORAGE AND SHIPMENT OF SILICON DISKS OR WAFERS

The present invention relates to packing containers, especially containers for the storage and shipment of silicon disks or wafers which containers are manufactured from a thermoplastic material suitable for injection molding.

Various kinds of shipping containers for silicon disks have been known, each of them exhibiting special measures for protecting the silicon product. In general, each shipping container consists of a cassette for housing silicon disks and of a bipartite box (a primary box part and a lid part). The primary box part and the lid part are fixedly joined when being closed so that the cassette is clamped in place and the silicon disks are desirably retained in a predetermined arrangement. In this way, breakage or minute movements of the silicon disks are to be avoided. Such movements could cause abrasion of the synthetic resin and contamination of the silicon, especially during closing of the box.

DOS No. 3,330,720 (which essentially corresponds to U.S. Pat. No. 4,450,960) is cited, for example, as being representative of the state of the art. The container described in these patent publications consists of three parts; namely, the two parts constituting the box proper or outer portion and a basket-like cassette arranged within the box and serving as a storage place for the silicon disks which are firmly seated in series in recesses provided for this purpose. This cassette is designed to conform to the standardized norms set up by the "Semiconductor Equipment and Materials Institute" (SEMI).

However, it has been found, inter alia, that in case of many conventional containers, a uniform and effective washing of the two box parts before insertion of the product cannot be flawlessly performed on account of the great depth of the disk seats, this depth also adversely affecting the drying out of the seats. It was furthermore noted that, in the conventional designs, the set of the inner cassette and the silicon disks housed therein is not adequately firm so that there is always still the possibility of movement of the disks with the containers being closed. Therefore, the object resides in eliminating these disadvantages of the known disk or wafer containers.

In accordance with this invention, the shipping container for silicon wafers or disks has three parts; namely, a lower or bottom box half and an upper or top box half which are releasably joined together in a shape-mating arrangement to form an outer protective box-like receptacle and a unitary cassette which is arranged in the box-like receptacle and which has support means for retaining a plurality of silicon wafers, preferably in parallel and spaced from each other. The upper and lower box halves are each provided with locking means that cooperate together in order to close and to lock the two box halves together and guide means that engage the cassette so that the cassette is prevented from shifting in any direction within the box-like receptacle and the upper half is provided with an auxiliary retaining means for blocking-off an open portion of the cassette and for retaining the silicon wafers within the cassette.

Another aspect of this invention is concerned with the unique construction of the cassette, per se. An essential and particularly important aspect of the cassette of the present invention is the shape of the feet or base support means.

The base support means includes two base strips arranged so that each end thereof exhibits a transverse rib bent outwardly at a right angle. These ribs, together with the strips are designed to lock into a profiled section provided in the bottom of the box-like receptacle. This profiled section has a length corresponding to the distance between the two transverse ribs; i.e., between the two ribs of the base strips bent outwardly at a right angle. This ensures a secure insertion of the cassette on the bottom part of the box-like receptacle.

The aforementioned transverse rib is not absolutely intended to encompass the entire length of the profiled section; it is sufficient for the outwardly bent rib or strip to correspond to half the width of the bottom profile section.

The spacing between the two base strips of the cassette is to be selected so that the outer rim or edge of these strips comes into contact with the inner longitudinal rims of two profiled sections in the bottom half of the box-like receptacle. This also represents an important feature of the present invention not existing in the conventional containers for silicon wafers.

In a presently known construction, the cassette is attached to the container bottom by struts that are arranged at the sidewalls of the outer containers and that directly engage an outer wall of the cassette.

Figure 1:
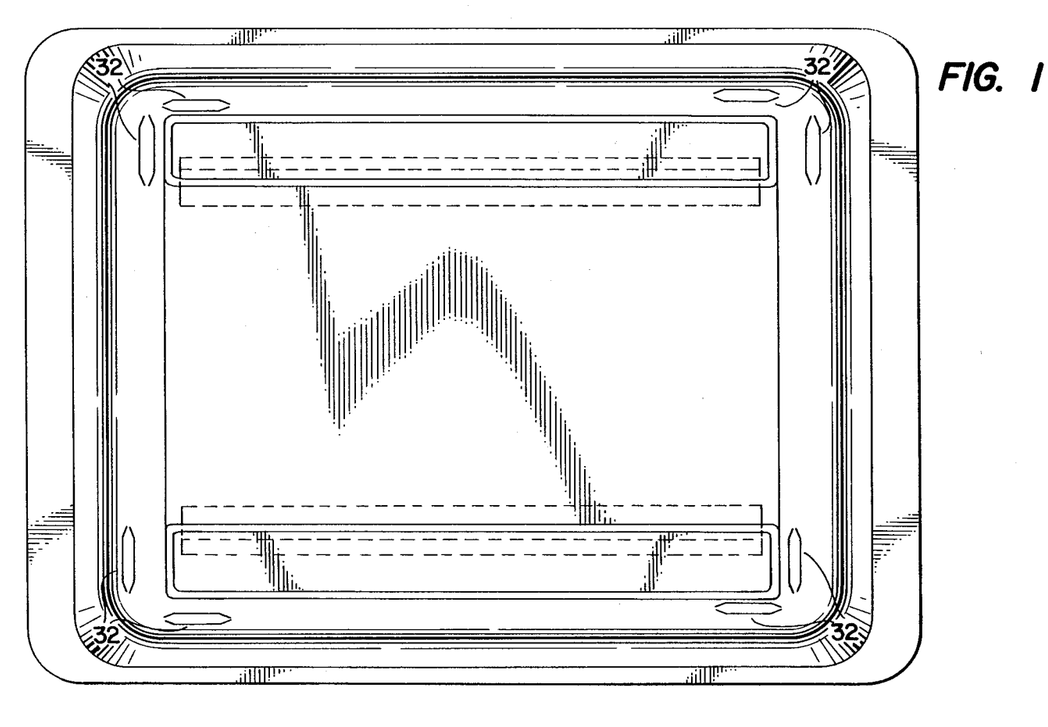
FIG. 1 is a plan view of the container according to the present invention.

According to the invention, the upper portion of the cassette is mounted in the upper or lid box half with the aid of holding ribs. Such ribs are known, per se, from, for example, FIG. 1 of DOS No. 3,330,720. It can be seen from this German publication that these ribs extend only perpendicularly out of the container lid into the interior of the container to such an extent that the ribs come laterally into contact with the rims of the silicon wafers. An important feature of the holding ribs according to the present invention, is to be seen in that the ribs are bent outward; namely, in such a manner that only the end of the outwardly bent portion of each rib touches the rim of a silicon wafer. In the contact point, these ribs exhibit, similarly to the known ribs, a notch forming a seat for the edge or rim of the silicon wafer.

The angular configuration of the ribs exhibits various advantages. The primary advantage resides in that, during closing of the receptacle, the silicon wafers urge the ends of these ribs upwardly so that the contact point between the ribs and the silicon wafers remains stationary and relative motion is avoided. In contrast thereto, in the prior art ribs, the ribs are forced toward the outside during closing of the outer container; however, such ribs slide along the edges of the silicon wafers an thereby contaminate the latter with the abradable synthetic resin making up the container.

The height of the cassette containing the silicon wafers corresponds quite exactly to the spacing (when the box-like receptacle is closed) between the bottom of the lower part of the receptacle and the profiled sections of the upper part (lid) of the receptacle.

These structural characteristics of the box-like receptacle and the cassette have the result that the cassette becomes lodged in the closed box-like receptacle in a way completely resistant against shocks, and the silicon wafers remain positively retained and fixed in the receptacle while it is being shipped and cannot be contaminated by abraded plastic material used to form the receptacle or the cassette because of relative sliding movement with respect to the ribs of the upper part or half of the receptacle.

Another structural feature for an improved mounting of the silicon wafers in the cassette resides, according to this invention, in a flawless rounding of the lower cassette section wherein the silicon wafers are arranged. The cassettes of the conventional containers do not show perfect rounding, but rather merely partial rounding or an angular rounding consisting of a plurality of interrupted straight lines.

The identical structural features of the two box halves of the container have proven to be very advantageous under practical conditions. In the first place, these features permit manufacture of the bottom and lid parts in the same mold so that these two parts can be readily interchanged. Indeed, the halves differ from each other only by the attachment of the holding ribs to the upper lid half; this attachment being effected with the aid of a movable carriage in the mold used for forming the box halves.

An outer rim of each of these halves has at one half of its periphery a projection, the height of which corresponds to the height of a corresponding shoulder extending along the other half of the periphery. This has the result that the projection of either half is always quite exactly in engagement with the fitting of the other half so that, upon closing of the container receptacle, an uninterrupted and equal-level fitting of the upper and lower halves is ensured in all instances.

As seen in the transverse direction, the rim projection is offset toward the outside with respect to the rim shoulder whereby a very precise fitting together is achieved--be it in transverse direction, or be it in longitudinal direction.

Each box half has, on one of its sides, a locking hook that can be bent elastically outwardly and on the other side an engagement tooth or flange for the elastic hook of the other part. Accordingly, the locking hook and the engagement tooth are the individual elements of a snap connection.

The box receptacle, consequently, has such a locking means that each bottom and lid half has a positive locking member on one side and a negative locking member on the other side, coming into engagement with the corresponding locking members of the other part and, thus, provide a locking structure on each side of the assembled box-like receptacle.

Additional details and advantages of the present invention will be apparent from the following description with reference to the accompanying drawings wherein a preferred embodiment is illustrated by way of example.

As can be seen from the drawings, the container comprises a bipartite box-like receptacle 1 and a cassette 2 for retaining the silicon wafer. As heretofore described, the two box halves; i.e., the bottom half and the upper half, have identical structure and identical depth with the exception of the rib arrangement provided in the upper half and, thus, can be produced in a single mold.

A first structural feature of the two box halves relates to the locking means for securing these two parts together. The means comprises a special design for the peripheral edges and the members of a snap lock arrangement provided on the short sides of each box half.

Figure 3:
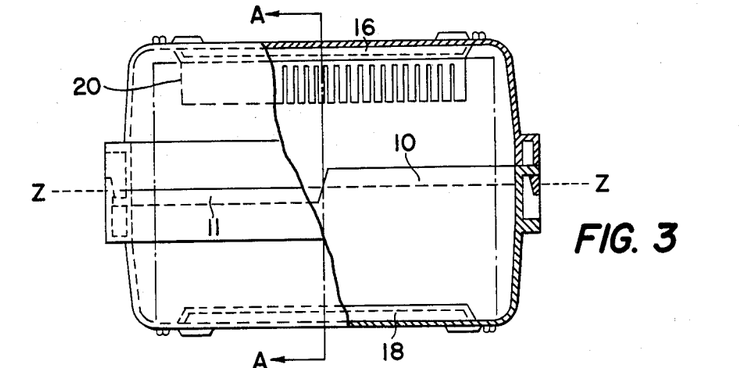
FIG. 3 shows an elevational view of the longer side of the container with portions of the two halves of the box receptacle partially broken away.

As illustrated in FIG. 3, the long lateral edge or rim of each box half is subdivided into two halves; in the first half, the rim is offset toward one side and, in the second half, the rim is offset to the same extent toward the other side of the center line Z—Z. As shown, this lateral rim exhibits a projection 10 alone one half and a shoulder 11 along the other rim half, having the same height with respect to the line Z—Z. Furthermore, as can be seen from FIGS. 4 and 5, an offsetting is also provided in the transverse direction of the rim so that, after linking or engagement the two box halves, the upper box half enters, with one half thereof, into the lower box half and the lower box half, with one half thereof, enters into the upper box half.

Figure 4:
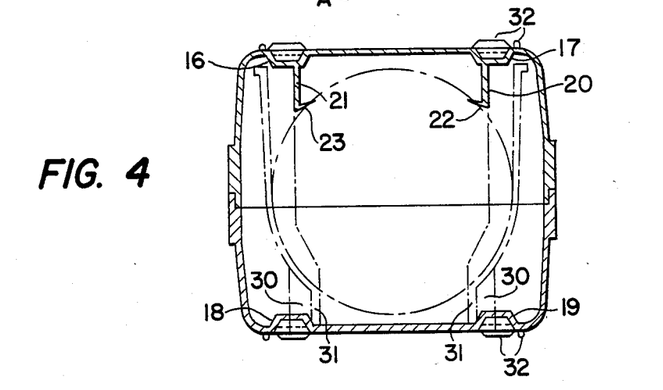
FIG. 4 is a cross-section taken along line A—A of FIG. 3.
Figure 5:
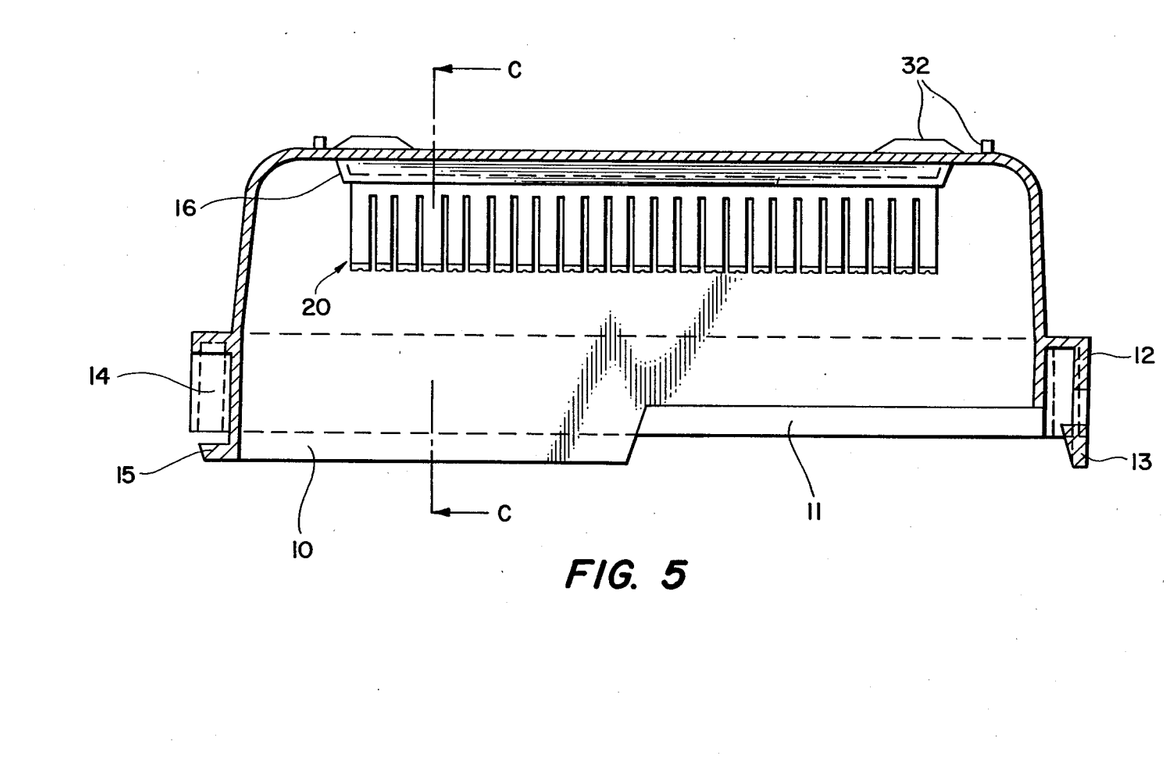
FIG. 5 is a cross-sectional view of the upper half of the container taken along line B—B of FIG. 2.
Figure 6:
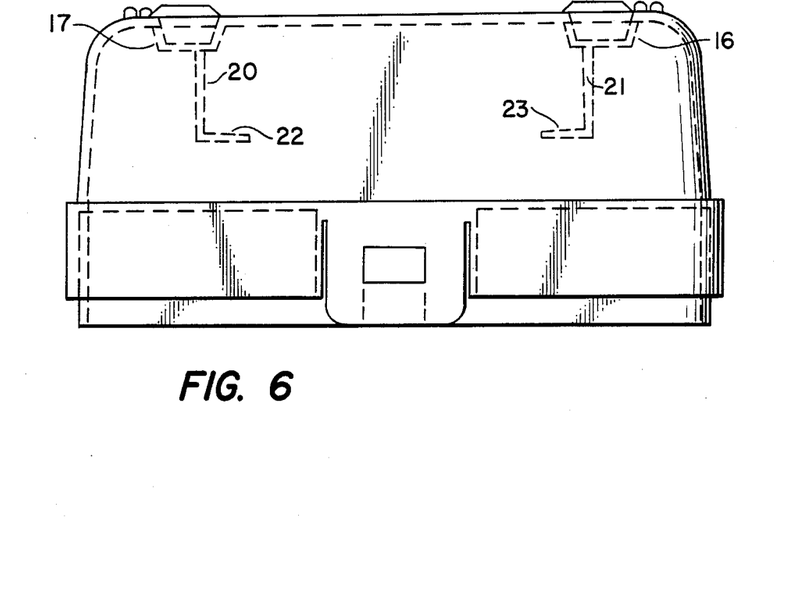
FIG. 6 is an elevational view of the shorter side of the upper half of the box-like receptacle.
Figure 7:
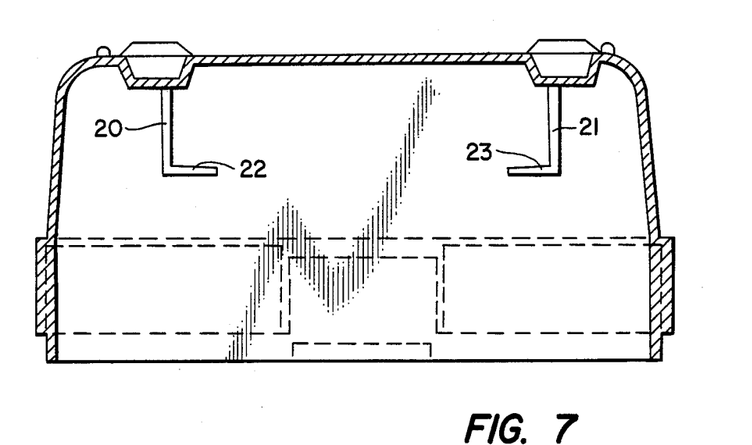
FIG. 7 is a cross-sectional view of the shorter side of the upper part of the receptacle shown in FIG. 6 taken along line C—C of FIG. 5.

It can be seen with respect to FIG. 5 that each box half exhibits a hook 12 that can be bent toward the outside, the end of this hook having a projection 13. On the other side, each box half has a seat or outer recess 14 with a tooth or flange 15. The elements 12, 13, on the one hand, and elements 14, 15 on the other hand, supplement one another structurally so that when the two box halves are joined (FIGS. 3 and 4), the result is not only a perfect coupling together thereof, and a precise mutual fit of the long and short rims, but also a mutual interlocking and closing of the hook arrangement 12, 13 of one box half with the seat arrangement 14, 15 of the other box half.

Two profiled sections 16, 17 and 18, 19 are provided on the bottom of each box part, these sections extending longitudinally and in parallel to each other and exhibiting the shape of a parallelepiped and projecting inwardly. These profiled sections are provided for blockage or closing off of the cassette as will be described hereinafter.

The lid portion of the box or, respectively, the upper box half, differs from the bottom portion of the box or lower box half only by the presence of two rib arrangements 20, 21 attached separately along the two profiled elements 16 and 17 in the mold. Such arrangements consist of a plurality of comb-shaped ribs which are elastically deformable and the lower ends 22 and 23 of which are bent away toward the inside at a right angle, as can be seen in greater detail in FIGS. 4, 5, 6 and 7. The bottom surface of each horizontal end segment 22, 23 exhibits a small notch to be engaged by the rim of a silicon wafer.

Figure 8:
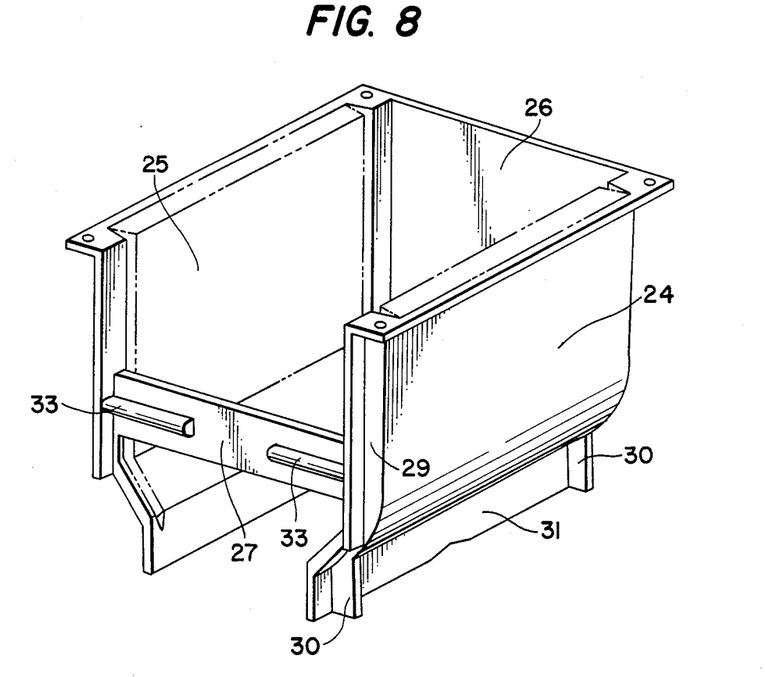
FIG. 8 is a perspective view of a cassette with only partially illustrated cavities or channels for receiving the silicon wafers.
Figure 9:
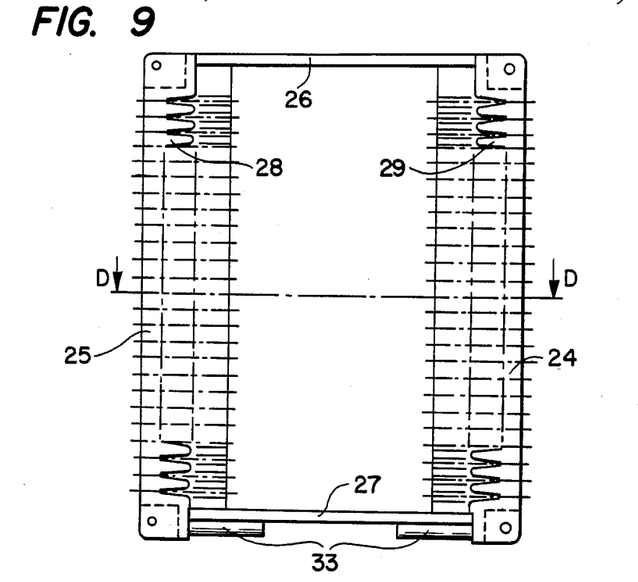
FIG. 9 is a top plan view of the cassette for accommodating the silicon wafers.
Figure 10:
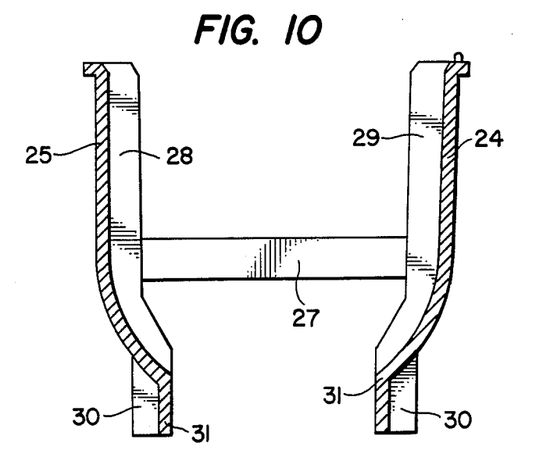
FIG. 10 is a cross-sectional view of the cassette shown in FIG. 9 taken along line D—D.

The cassette accommodating the silicon wafers will now be described in detail with reference to FIGS. 8 to 10. From a general viewpoint, this cassette has a structure similar to the cassettes known from the state of the art and consists of two longitudinal walls 24, 25 joined by two transverse walls 26, 27 and exhibiting a set of transverse ribs 28, 29 forming a group of channels for the accommodation of the silicon disks. It is to be noted that the lower portion of the two longitudinal walls 24 and 25 exhibits a uniform circular shape in correspondence with the radius of silicon disks. The silicon wafers or disks are inserted through the open top into the channels.

Figure 2:
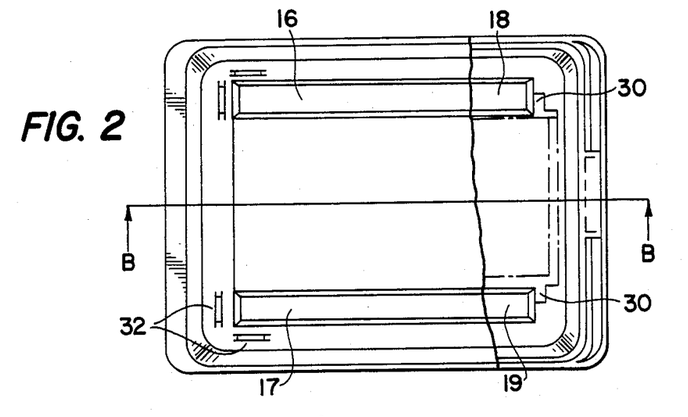
FIG. 2 shows a similar plan view of the container according to the invention as shown in FIG. 1, with a portion of the upper half broken away.

Essential differentiating features of the cassette, according to this invention, include the transverse ribs 30 arranged on the substantially open bottom of the cassette and mounted to the base strips or feet 31 in the proximity of the four corners of the cassette. As can be seen, in particular, from FIG. 2, the ribs 30 and the profiled elements of the lower box half come into engagement in order to center the cassette within the box-like receptacle and to avoid an shifting of the cassette in the transverse and longitudinal directions.

A preferred embodiment of the cassette resides in that one of the two transverse walls (in FIG. 8, wall 27) is designed in the shape of a narrow web reinforced by profiled strips 33. These profiled strips are separated from each other in the middle of the web. The wall 27 is directly connected to the sidewalls 24 and 25 and can be arranged at the level of the centers of the silicon wafers to be inserted in the cassette, as well as at a lower level; i.e., below the centers of the wafers.

As can be observed from FIG. 4, the cassette is retained in the box-like receptacle, not only by the cooperation of the feet 31 and the ribs 30 of the cassette with the profiled elements 18 and 19, but also by the cooperation between the upper box half and the rib arrangements 20 and 21 which come into engagement with the upper and, respectively, lateral edges of the silicon wafers arranged in the transverse ribs 28 and 29 of the cassette.

The deformable ribs 20, 21 serve for blocking or retaining the silicon wafers within the cassette. The spacing between, respectively, two ribs corresponds exactly to the spacing between, respectively, two transverse ribs 28 and 29. The ribs 20 and 21 are arranged in the lid so that they come to lie exactly above the grooves or channels between the transverse ribs. As can be seen from FIG. 4, the individual deformable ribs and, especially their horizontal segments 22, 23, block and engage the silicon wafers by a uniformly distributed pressure effect, as contrasted with the conventional ribs exerting a localized and, consequently, higher pressure and, accordingly, presenting a greater danger of breakage to the silicon wafers. It is, furthermore, to be noted that the blocking effect takes place without sliding between the wafer edges and the ribs, since the ribs are blocked against the cassette rim and are deformed only at their horizontal segments encompassing the rim of each silicon wafer.

The rounded configuration of the channels or groove receiving the wafers permits a uniformly distributed contacting with the rims of the wafers whereby spotwise pressures and rotational shifting of the wafers are avoided and, furthermore, the objective is attained that the wafers are in alignment along their axis due to the fact that the encompassing seat neutralizes possible shifting from the linear arrangement of the wafers to an ample extent, which shifting can be caused by a possible resting of the wafers on their primary flattened areas.

Another structural feature of the box, according to this invention, relates in that external feet or support elements are provided at the bottom half and at the lid half. The drawing shows two feet 32 for each corner located at a right angle in geometrically offset positions of the "tongue-and-groove" type, making it possible thereby to stack several boxes without the danger of an unintended collapse.

It will be understood that the parts of the container of this invention are formed by molding of a thermoplastic resin such as polyvinyl chloride, polyethylene, polypropylene, ABS resin or the like.

The aforementioned figures, a preferred embodiment of the present invention, has been described. However, it will be understood that various modifications and variations of the structural details can be employed by those skilled in the art without abandoning the scope of this invention.

What is claimed is:

1. A container for the storage and shipment of silicon wafers which comprises a lower box half and an upper box half which are joined releasably in a shape-mating fashion for the formation of an outer protective box-like receptacle, and a cassette adapted to be arranged in said box-like receptacle for the accommodation and storage of a plurality of silicon wafers, closure means on the lower and upper box halves for sealing the two box halves and for locking the halves together; guide means in the lower and upper box halves for engaging the cassette so that the shifting of the cassette within the box-like receptacle is prevented and auxiliary retaining means provided in the upper box half for blocking-off the cassette and for retaining the silicon wafers within the cassette; said guide means including two profiled sections extending longitudinally in the lower box half, each of the sections projecting inwardly within the box and being arranged parallel to the other, said sections being adapted to engage lower side surfaces of the cassette whereby longitudinal and lateral movement of the cassette is prevented.

2. A container for the storage and shipment of silicon wafers according to claim 1, wherein said guide means comprises four profiled sections, two in each box half, which exhibit an approximately parallelepiped-shaped configuration, are mutually parallel, project toward the inside of the box, and extend symmetrically to the longitudinal axis of the box-like receptacle.

3. A container for the storage and shipment of silicon wafers according to claim 1, wherein said guide means further includes other two profiled sections extending longitudinally in the upper box half, each of said other profiled sections projecting inwardly within the box and being arranged parallel to each other, said other profiled sections being adapted to engage upper surfaces of said cassette whereby movement of the cassette between the two box halves, in a locked condition, is prevented.

4. A container for the storage and shipment of silicon wafers according to claim 1, wherein said cassette comprises two longitudinal walls joined by two transverse walls, said longitudinal walls having projecting transverse ribs for the formation of channels for the accommodation of the silicon wafers; ribs located at the bottom of the cassette, said ribs being attached to base strips in the proximity of the four corners of the cassette and engaging into the guide means of the lower box half.

5. A container for the storage and shipment of silicon wafers according to claim 4, wherein one of the transverse walls is fashioned as a web on which profiled strips are arranged.

6. A container for the storage and shipment of silicon wafers according to claim 5, wherein the profiled strips are separated from each other by a portion of the web.

7. A container for the storage and shipment of silicon wafers according to claim 1, wherein said cassette has seats for accommodating the silicon wafers in the cassette; said seats having a circularly curved bottom portion whereby a bette distributed contact is made possible between the seats and the wafers and an improved longitudinal alignment of the wafers is achieved.

8. A container for the storage and shipment of silicon wafers according to claim 4, wherein said cassette has a height corresponding to the internal spacing, measured with the box-like receptacle being closed, between the bottom of the lower box half and an inner rim of the guide means arranged in the upper box half.

9. A container for the storage and shipment of silicon wafers according to claim 2, wherein said cassette has base strips, the spacing between outer rims of the base strips corresponding to spacing between the inner rims of the two profiled sections provided in the lower box half.

10. A container for the storage and shipment of silicon wafers according to claim 2, wherein said cassette has two ribs on each lower side, spacing between inner rims of the two ribs on one side of the cassette corresponding to a length of the profiled sections arranged in the lower box half.

11. A container for the, storage and shipment of silicon wafers according to claim 1, wherein the two box halves exhibit on outer bottom surfaces thereof at each corner two feet arranged at a right angle and offset in the manner of a "tongue-and-groove" joint, making it possible to stack the boxes.

12. A container for the storage and shipment of silicon wafers which comprises a lower box half and an upper box half which are joined releasably in a shape-mating fashion for the formation of an outer protective box-like receptacle, and a cassette adapted to be arranged in said box-like receptacle for the accommodation and storage of a plurality of silicon wafers, closure means on the lower and upper box halves for sealing the two box halves and for locking the halves together; guide means in the lower and upper box halves for engaging the cassette so that the shifting of the cassette within the box-like receptacle is prevented and auxiliary retaining means provided in the upper box half for blocking-off the cassette and for retaining silicon wafers within the cassette; said auxiliary means provided in the upper box half comprising a plurality of ribs attached to profiled sections extending inwardly into the container and located in an inner wall portion of the upper box half, each end of individual ribs being bent inwardly at a right angle to the remaining portion of the rib whereby only an inwardly bent end portion of each rib touches a rim of a silicon wafer and silicon wafers within the cassette act to urge the bent end portions of the ribs upwardly.

13. A container according to claim 12, wherein the bent-away ends of the said ribs are provided with a lower notch that engages with the wafers.

14. A container according to claim 12, wherein said ribs are elastically deformable.

15. A cassette for the shipment of silicon wafers in a closed two-part box-like receptacle which comprises two longitudinal walls joined by two transverse walls to form four corners; the longitudinal walls having transverse ribs projecting inwardly to form channels for the accommodation of a plurality of silicon wafers, parallel base strips extending longitudinally along the bottom of the cassette, ribs provided on the bottom of the cassette, said ribs being attached perpendicularly to the base strips in the proximity of the four corners of the cassette and being adapted to engage into a guide means in a lower box part of the receptacle.

16. A cassette according to claim 15, wherein one of the transverse walls is fashioned as a web on which a profiled strip is arranged.

17. A cassette according to claim 16, wherein two profiled strips are arranged on the web, the profiled strips being separated from each other in the middle of the web.

18. A cassette according to claim 15, wherein the channels for accommodating the silicon wafers in the cassette exhibit a circularly curved bottom portion whereby a better distributed contact is made possible between the channels and the wafers, and an improved longitudinal alignment of the wafers is achieved.

19. A cassette according to claim 15, wherein the height of the cassette corresponds to the internal spacing, measured with the box-like receptacle having lower and upper box parts being closed, between a bottom of the lower box part and an inner rim of profiled sections arranged in the upper box part.

20. A cassette according to claim 19, wherein the spacing between outer rims of the base strips corresponds to the spacing between inner rims of two profiled sections provided in the lower box part.

21. A cassette according to claim 20, wherein the spacing between the inner rims of two transversely extending ribs on one side of the cassette corresponds to the length of the two profiled sections arranged in the lower box part.

* * * * *